Figure 1:
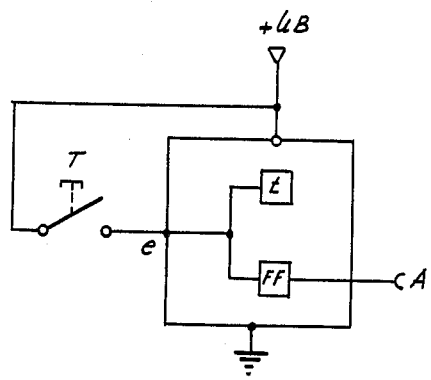

United States Patent [19]

Speidel

[11] 4,307,301

[45] Dec. 22, 1981

[54] ELECTRIC CIRCUIT ARRANGEMENT FOR REPLACEMENT OF AN ELECTRIC SWITCH, WITH COMBINED PUSHING AND LOCKING FUNCTION FOR AUTOMOTIVE VEHICLES

[75] Inventor: Volker Speidel, Schalksmuhle, Fed. Rep. of Germany

[73] Assignee: Firma Leopold Kostal, Fed. Rep. of Germany

[21] Appl. No.: 64,545

[22] Filed: Aug. 8, 1979

[30] Foreign Application Priority Data

Nov. 13, 1978 [DE] Fed. Rep. of Germany ....... 2849236

[51] Int. Cl.³ .............................................. B60Q 1/26
[52] U.S. Cl. ................................. 307/10 LS; 340/78; 315/77; 315/136
[58] Field of Search ................... 307/10 LS, 139, 142, 307/232, 234; 340/74, 76, 78; 361/194, 196; 315/77, 136

[56] References Cited

U.S. PATENT DOCUMENTS 3,656,103  4/1972  Tanaka et al. .................... 315/77 X Primary Examiner—L. T. Hix
Assistant Examiner—James L. Dwyer
Attorney, Agent, or Firm—Jacobs & Jacobs

[57] ABSTRACT

An electric circuit arrangement to replace the combined pushing and locking electric switch of the type used in DC fed automobile blinker systems, characterized by a signal detection unit controlled by a push switch and comprising a timer member, an integrating member and a bi-stable storage member whose output controls a blinker relay or subsequent electric component. Actuation of the push switch generates a pulse which directly controls a flip-flop and a timer member as a function of the length of time of actuation of the push switch, the length of such time in relation to the setting of the timer acting to set or re-set the flip-flop. Two push switches are provided which control the timer and two bi-stable flip-flops whose outputs are cross-coupled.

7 Claims, 6 Drawing Figures

ELECTRIC CIRCUIT ARRANGEMENT FOR REPLACEMENT OF AN ELECTRIC SWITCH, WITH COMBINED PUSHING AND LOCKING FUNCTION FOR AUTOMOTIVE VEHICLES

The present invention relates to an electric circuit arrangement for replacement of an electric switch with combined pushing and locking function, such as used for instance in DC-fed automobile blinker systems, by a push switch with signal-detection unit arranged behind it, particularly of electronic type.

Operating elements in the form of switches with pushing and locking function in one unit are used wherever the same output signal is desired on the one hand as a function of the duration of actuation—pushing function—and on the other hand independently of the duration of actuation—locking function.

As a rule they are designed in such a manner that when a first pressure point is reached the switch operates in the manner of a pure pushbutton switch; when the pressure point is exceeded the switch is locked. While in the first case the switch returns to its basic position at the end of the actuation, in the second case it can in the case of switches with pushbutton only be brought out of the locked position by again being pushed; in the case of switches having an operating lever it is brought into the basic position by actuation in opposite direction. These functions can also be obtained by a parallel connection of one locking switch and one pushbutton switch.

The object of the present invention is to effect both the pushing function and the locking function with a push switch having an electronic system arranged behind it.

In order that a push switch with electronic system arranged behind it can perform these functions, the following practical requirement is established for the above-described push/lock switch, referred to the course of operation.

If a continuing signal is desired, the actuating process terminates when the pressure point is exceeded since the switch is locked. This operating process is always shorter in time than the shortest push duration.

Subject to this condition, a pushbutton with electronic system behind it can be developed in the manner that the signal detection unit controlled by a push switch consists of a timer member, particularly an integration member, and a bi-stable storage member whose output controls a subsequent electric component, for instance a blinker relay.

If the operating process on the push is shorter than the time set on the timer member, the flip-flop stage is set. Its output signal is then applied until another push, this corresponding to a locking function. If the period of actuation is greater than the time set on the timer member, then the output signal of the flip-flop stage upon the end of the actuation returns into the basic position, which corresponds to the pushing function.

There is no longer any dependence on the actuating stroke of the switch. The comparison of the time of actuation with the predetermined time is alone determinative as to whether the output signal of the flip-flop stage does or does not return into the basic position upon the end of the actuation of the switch. The time of the integrator member may be adjusted if necessary.

When using push switches which are not free of chattering it is necessary to provide a chatter suppression behind the pushbutton switch.

In this way an unequivocal single input signal is produced.

Another feature is that the pulse which comes from the push switch upon its actuation and directly controls the flip-flop stage and the timer member, depending on the length in time of the push switch actuation either sets or resets the flip-flop stage in case of a shorter actuation of the switch than corresponds to the time setting of the timer member, or sets the flip-flop stage in case of a longer actuation of the switch than the time setting of the timer member, the timer member resetting the flip-flop stage after the termination of the actuation of the switch. A preferred detail resides in the timer member consisting of an RC-member, a NOT-member or inverter and an AND-member, the AND-member being controlled via the RC-member and the NOT-member, and the output signal of the AND-member controlling the resetter input of the bi-stable flip-flop.

In order to obtain an unequivocal signal it is advantageous for a Schmitt trigger to be connected as threshold switch between the RC-member and the corresponding input of the AND-member.

One detail is that the chatter suppression is effected via a capacitor, a resistor, and a Schmitt trigger.

In order to bring the flip-flop stage into a well-defined position upon the application of the supply voltage, the resetter of the flip-flop stage is controlled via a capacitor which is connected to operating voltage.

In order to make the arrangement suitable, for instance, for the blinker or window-opener actuation of automotive vehicles it is proposed that two push switches be provided which control a timer member and two bi-stable flip-flops whose outputs are cross-coupled.

The push switches can then be arranged on a steering wheel lever for the blinker actuation, the one switch being arranged on the bottom of the lever knob and the other on its top.

The invention will be described in detail below with reference to the figures and following description.

Figure 2:
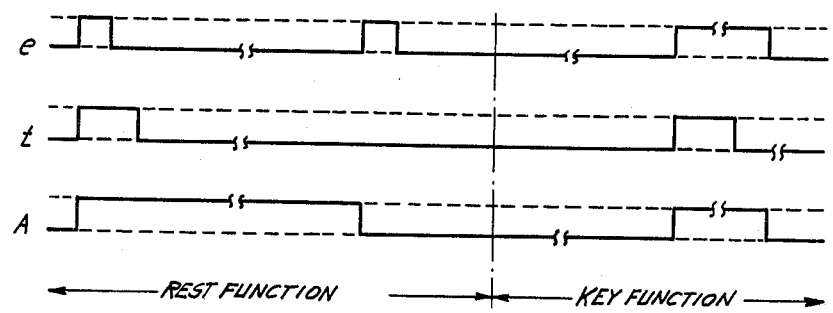
Figure 3:
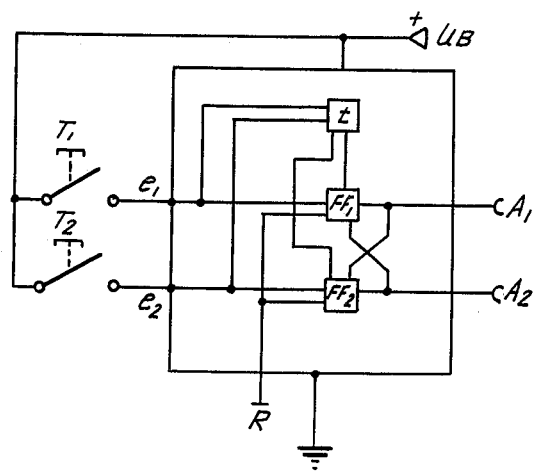
Figure 4:
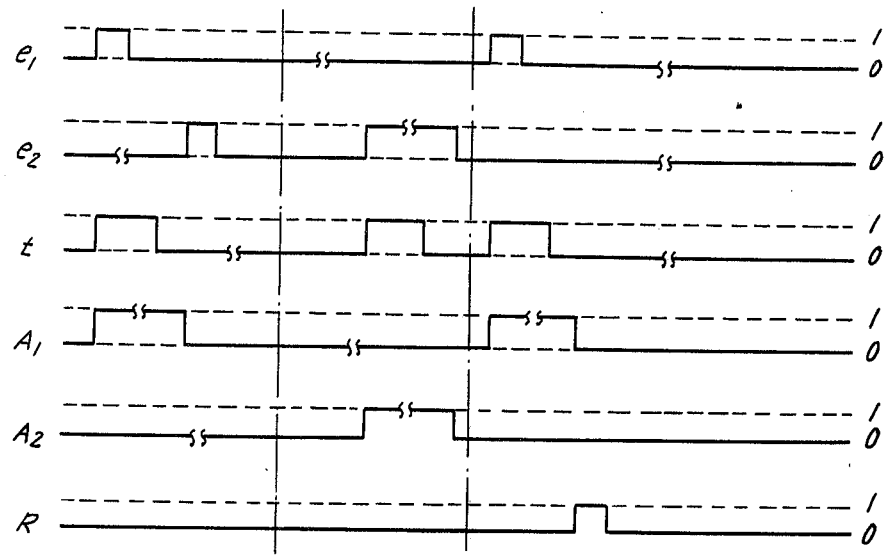
Figure 5:
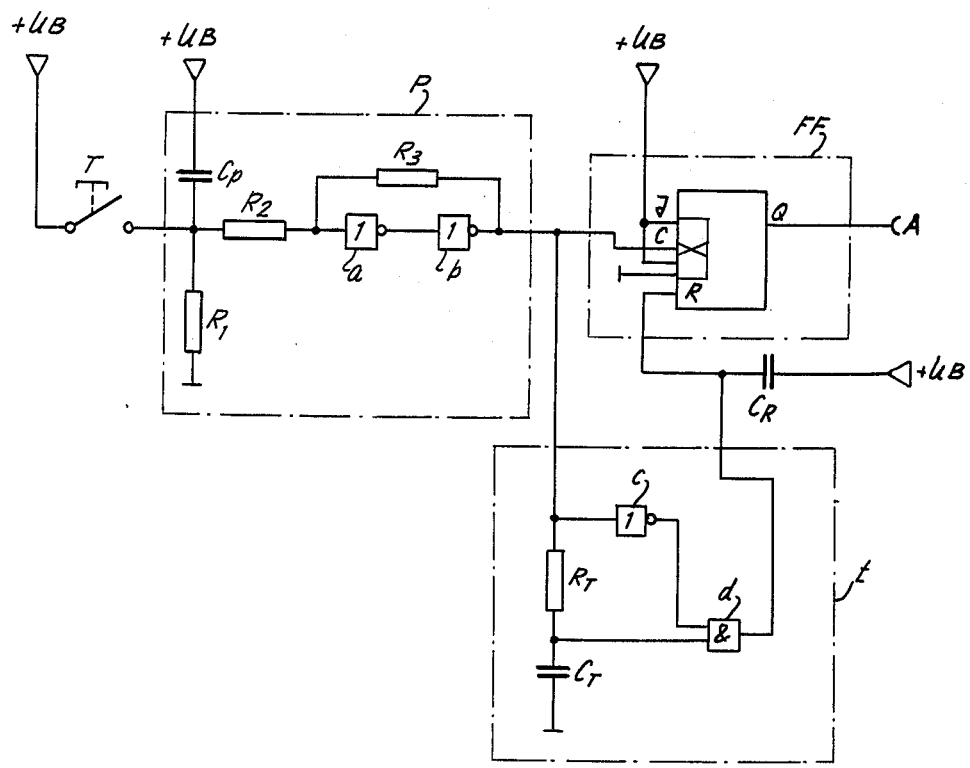
Figure 6:
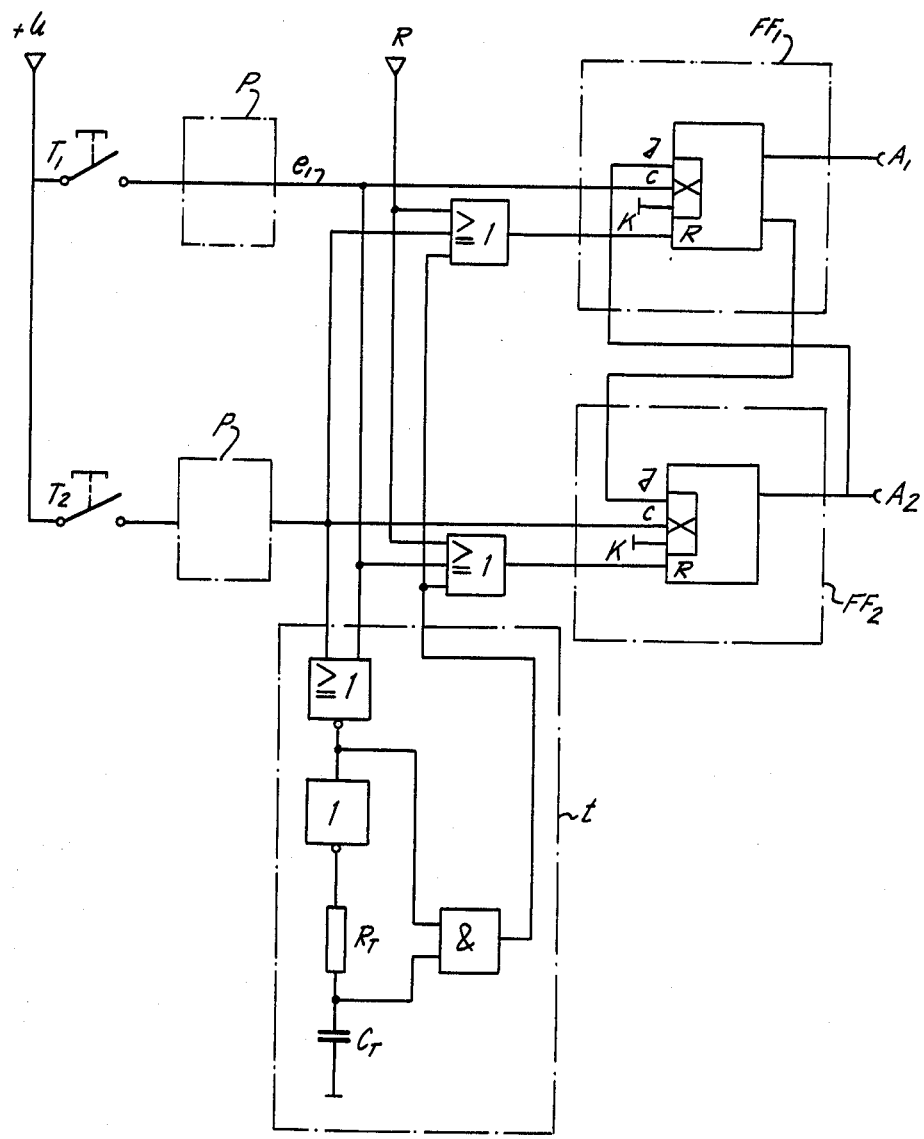

In the drawing:
FIG. 1 is a circuit diagram;
FIG. 2 is a function diagram thereof;
FIG. 3 shows a variant of FIG. 1;
FIG. 4 shows a corresponding function diagram;
FIG. 5 shows a detailed circuit of the type of FIG. 1;
FIG. 6 shows a detailed circuit of the type of FIG. 3.

The pushbutton T operates on an electronic system which consists essentially of a timer member t and a bi-stable flip-flop FF. The arrangement is connected to a supply voltage $U_B$ (DC voltage) of the electrical system of an automobile, with its minus side grounded. Upon actuation of the pushbutton switch T the flip-flop stage FF is set. The output signal is then applied until the pushbutton T is again actuated if the time of actuation is less than the time of the timer member t (locking function).

The corresponding course of operation is shown in the left-hand part of FIG. 2. e is the duration of the pushbutton pusher, t the time set on the timer member t, and A the logical statement of the output signal, namely 1 or 0.

If the time of actuation of the pushbutton switch T is longer than the time t, then the output signal returns into the basic position after the end of the actuation (right-hand part of FIG. 2).

FIGS. 3 and 4 show a variant in which two pushbutton switches $T_1$, $T_2$, two flip-flop stages $FF_1$, $FF_2$, and two outputs $A_1$, $A_2$ are present.

The function corresponds to that of the embodiment of FIG. 1, but a set flip-flop $FF_1$ or $FF_2$ can be cancelled only by actuation of the pushbutton not associated with it, for instance $FF_1$ by $T_2$, the output associated with the pushbutton $T_2$ remaining in the basic position and being set only by again depressing the same pushbutton $T_2$. In this way assurance is had that after the release of a flip-flop stage both outputs are in the basic position.

By a cross-coupled connection, assurance is furthermore had that in each case only one output $A_1$ or $A_2$ can be set.

FIG. 4 is again a time diagram; in it $e_1$ and $e_2$ are the inputs coming from the pushbutton switches $T_1$, $T_2$, t is the timer member, and $A_1$ and $A_2$ are the outputs of the flip-flop stages $FF_1$ and $FF_2$, their logical statement being 1 or 0; R represents a resetter. The left-hand part of FIG. 4 shows the course corresponding to the locking function with resetting by actuation of the opposing pushbutton, while the right-hand part shows the case in which the resetting is effected by the resetter R. The central portion corresponds to the push function.

As example of use, there enters into consideration an ordinary blinker lever in which the switches $T_1$ and $T_2$ are arranged on the top and bottom of the end of the lever respectively. In order to set the right blinker the lower switch $T_2$ is actuated. For the resetting the upper switch $T_1$ is activated and conversely for the left blinker. Instead of the resetting by pushbutton actuation there can also be provided a resetter R which, upon the return of the steering wheel, resets the said flip-flop stage $FF_1$ or $FF_2$.

Another possible use is for electric window openers in automobiles, the resetter R being developed as limit switch.

In FIG. 5 the diagram of FIG. 1 is shown in greater detail.

With pushbutton switches T which are not free of chattering the circuit P is necessary. The suppression of chattering is effected by a capacitor $C_p$ and a resistor $R_1$. In order to operate with the necessary steepness on the flip-flop stage FF, a Schmitt trigger, consisting of the inverters a, b and the resistors $R_2$, $R_3$, is necessary.

The timer member t consists of the integrating member $C_T$, $R_T$, an inverter c, and an AND-member d controlled by the two of them and which in its turn controls the reset input R.

With the actuation of the pushbutton T the flip-flop stage FF is set by the positive flank (output A = logical "1") if it was previously reset, or is reset (output A = logical "0") if it was previously set. If the operation is completed and the capacitor voltage of $C_T$, due to the charging during the operating process, is less than the input threshold voltage of the AND-gate d, the flip-flop stage FF is not reset (logical "0" on the reset input R). This corresponds to a locking function.

If, at the end of the actuation, the capacitor voltage at $C_T$ is greater than the input threshold voltage of the AND gate d, the flip-flop stage FF is reset by a logical "1" signal at R. This corresponds to a push function.

The inverter of the timer member t prevents the flip-flop stage FF from being reset during the actuation even if the capacitor voltage at $C_T$ has exceeded the threshold voltage of gate d. The release of this gate takes place in any event only with opened contact of the pushbutton T by logical "1" at the output of the inverter c.

The capacitor $C_R$ is necessary in order to bring the flip-flop stage FF into a well-defined position upon the connecting of the supply voltage.

FIG. 6 shows a circuit in accordance with FIG. 3 in which the resetting of a set flip-flop stage is effected via the switch not associated with it or via an additional reset possibility R (limit switch or the like) or via the timer member t.

What is claimed is:

1. An electric circuit arrangement for replacement of an electric switch having a combined pushing and locking function of the type used in DC fed automobile blinker systems, a push switch having a signal detection unit behind the electric switch, optionally of electronic type, characterized in that the signal detection unit is controlled by the push switch and comprises a timer member, an integrating member and a bi-stable storage member whose output controls a blinker relay or subsequent electric component, the pulse generated by the actuation of the push switch directly controls an associate flip-flop and a timer member as a function of the length of time of the push switch actuation either, in the case of shorter actuation of the switch than corresponds to the time setting of the timer member merely sets or resets the flip-flop, or, upon longer actuation of the switch than corresponds to the time setting of the timer member, sets the flip-flop, the timer member resetting the flip-flop upon termination of the actuation of the switch.

2. An arrangement according to claim 1, wherein the timer member consists of an RC-member, a NON-member or inverter and an AND-member, the AND-member being controlled via the RC-member and the NON-member and the output signal of the AND-member and the timer member controls the resetter of the associated bi-stable flip-flop.

3. An arrangement according to claim 2, wherein a Schmitt trigger is connected as a threshold switch between the RC-member and the corresponding input of the AND-member.

4. An arrangement according to claim 1, wherein the reset input of the flip-flop is controlled via a capacitor which is connected to operating voltage.

5. An arrangement according to claim 1, wherein there are two of said push switches to control the timer member of two bi-stable flip-flops whose outputs are cross-coupled.

6. An arrangement according to claim 5, wherein the said push switches are located on a steering wheel lever of the automobile for blinker actuation.

7. An arrangement according to claim 5, wherein the said push switches are located on a steering wheel lever of the automobile for blinker actuation, one switch being on the bottom of the lever knob and the other on the top thereof.

* * * * *